(12) United States Patent
Bernardon

(10) Patent No.: US 7,068,095 B2
(45) Date of Patent: Jun. 27, 2006

(54) AMPLIFIER CIRCUIT

(75) Inventor: Derek Bernardon, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/032,703

(22) Filed: Jan. 10, 2005

(65) Prior Publication Data

US 2005/0200404 A1    Sep. 15, 2005

Related U.S. Application Data

(63) Continuation of application No. PCT/DE03/02304, filed on Jul. 9, 2003.

(30) Foreign Application Priority Data

Jul. 10, 2002   (DE) ................. 102 31 183

(51) Int. Cl.
*H03F 1/02* (2006.01)
(52) U.S. Cl. ............... 330/9; 330/10; 330/207 A; 330/251
(58) Field of Classification Search ................. 330/10, 330/9, 207 A, 251; 381/94.5; 375/238; 327/419
See application file for complete search history.

(56) References Cited

U.S. PATENT DOCUMENTS

| | | | |
|---|---|---|---|
| 5,262,733 A * | 11/1993 | Nakajima et al. ............. | 330/10 |
| 5,559,467 A | 9/1996 | Smedley | |
| 5,590,033 A * | 12/1996 | Kawano ....................... | 363/25 |
| 6,016,075 A * | 1/2000 | Hamo ........................... | 330/10 |
| 6,707,337 B1 * | 3/2004 | Noro ............................ | 330/10 |
| 2002/0060605 A1 | 5/2002 | Kowkutla et al. | |

FOREIGN PATENT DOCUMENTS

| | | |
|---|---|---|
| EP | 0 503 571 A1 | 9/1992 |
| WO | 00/55966 A1 | 9/2000 |

OTHER PUBLICATIONS

Search report for PCT/DE03/02304.*
"A Class D Amplifier Using MOSFETs with Reduced Minority Carrier Lifetime", Jon Hancock, AES Journal of the Audio Engineering Society, No. 9, New York, Sep., 1991, 13 pages.
"Understanding Buck Power Stages in Switchmode Power Supplied", Application Report, Texas Instruments, Mixed Signal Products, SLVA057, Mar., 1999, 36 pages.

* cited by examiner

*Primary Examiner*—Michael Shingleton
(74) *Attorney, Agent, or Firm*—Eschweiler & Associates, LLC

(57) ABSTRACT

The invention is directed to an amplifier circuit based on the principle of a class D amplifier. To avoid unwanted convolution effects and to improve the power supply rejection ratio, provision is made for the amplitude of the ramp signal used for pulse width modulation to track proportionally the supply voltage for the amplifier circuit. For this purpose, the ramp signal generator has an amplitude control input suitably connected to supply and reference potentials. This ensures a constant duty ratio which is independent of the supply voltage. The present circuit may be used, for example, as a DC/DC converter or as an audio amplifier.

20 Claims, 1 Drawing Sheet

AMPLIFIER CIRCUIT

REFERENCE TO RELATED APPLICATION

This application is a continuation of PCT/DE03/02304, filed Jul. 9, 2003 which was not published in English, that claims the benefit of the priority date of German Patent Application No. DE 102 31 183.8, filed on Jul. 10, 2002, the contents of which are herein incorporated by reference in their entirety.

FIELD OF THE INVENTION

The present invention relates to an amplifier circuit.

BACKGROUND OF THE INVENTION

Audio signals are normally amplified using class D amplifiers, inter alia. In line with the underlying principle, a reference signal is first compared with a signal fed back from the output and a corresponding error signal is output. This signal is processed on a pulse width modulation basis using a sawtooth signal and is passed to an output amplifier stage. In this case, the output stage is operated so as to switch at a particular duty ratio. To maintain a flow of current at the output, a freewheeling diode and an inductor are provided at the output. It is thus possible to provide a constant output current at the output.

FIG. 1 in the "Journal of the Audio Engineering Society", Audio Engineering Society, New York, USA, vol. 39, No. 9, Sep. 1, 1991, pages 650, 662 shows an amplifier circuit with a differential amplifier whose output side is connected to a first input on a comparator. A second input on the comparator is supplied with a sawtooth-waveform signal. The output side of the comparator is connected to an output circuit which is pulse width modulated.

Printed document EP 0503571 A1 likewise shows a pulse width modulated amplifier circuit whose signal input is connected to a comparator. A second input on the comparator is supplied with a sawtooth-waveform signal. The output of the comparator is connected to an output stage.

However, such amplifiers have relatively poor properties in terms of the power supply rejection ratio (PSRR). If the low-level signal response of a circuit of this type is considered, the ratio of the output voltage to the input voltage is $$\frac{Vout}{Vin} = \frac{d}{1 + s^2 LC},$$

where L and C are the values of an LC filter at the output and d is the duty ratio of the pulse width modulation. The gain of the transfer function Vout/Vin is accordingly proportional to the duty ratio d, which may be between 0 and 1. However, this term determines the denominator of the formula for describing the power supply rejection ratio. Accordingly, fluctuations in the supply voltage or radio-frequency interference components in the supply voltage result in relatively severe unwanted effects on the output signal from the amplifier circuit.

A further problem of the principle described is the unwanted convolution of signals. If the supply voltage for the output stage behaves like a relatively low-frequency sinusoidal oscillation but the useful signal is likewise a (higher-frequency) sinusoidal oscillation, then the low-level signal gain also varies sinusoidally. The resultant harmonics are at the summed frequency and the differential frequency between the frequencies of the two signals at an amplitude which corresponds to half of the product of the amplitudes of the two signals. The problem is of great significance particularly because the interference may be at frequencies below the cut-off frequency of the low-pass filter at the output and is therefore not filtered out.

The relatively poor power supply rejection ratio is normally countered by increasing the signal gain. This increases the power consumption, however.

The convolution problems described may be reduced by reducing the noise components and interference components on the supply voltage, for example by using a linear controller. This severely reduces the efficiency of the amplifier, however.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to an amplifier circuit which operates on the basis of the class D principle and has an improved power supply rejection ratio.

In one embodiment of the invention, the amplifier circuit comprises an input for supplying a useful signal which is to be amplified, and an output for tapping off an amplified useful signal. The circuit further comprises a differential amplifier having a first input, which is connected to the input of the amplifier circuit, a second input, which is coupled to the output of the amplifier circuit, and an output. A comparator is also provided having a first input, which is connected to the output of the differential amplifier, and a second input, to which a periodic signal is supplied, along with an output stage having an input, which is connected to an output of the comparator, an output, and having a supply connection for supplying a supply voltage thereto. The circuit also comprises a signal generator which is connected to the second input of the comparator and provides the periodic signal at an amplitude which is proportional to the supply voltage for the output stage. The signal generator is configured in a phase locked loop to regulate the frequency of the periodic signal on the basis of a reference clock.

In accordance with the present invention, the periodic signal used for pulse width modulation is provided such that its amplitude is always proportional to the supply voltage for the amplifier circuit, particularly for the output stage of the amplifier circuit.

In accordance with another exemplary embodiment of the invention, the duty ratio is always proportional to the supply voltage.

In accordance with yet another embodiment of the invention, the transfer function for the output voltage in relation to the supply voltage in consideration of the low-level signal response is ideally 0, in practical terms at least very low, which means that the power supply rejection ratio PSRR is greatly improved.

The quotient of the supply voltage and the amplitude voltage of the periodic signal is always constant in one example of the present invention. However, this quotient also describes the low-level signal gain, in particular, of the circuit, and the circuit described accordingly always operates at constant gain such that an additional advantage is that no convolution with a harmonic signal component of the supply voltage may arise.

If the periodic signal, which, in accordance with the present invention, is used for pulse width modulation, is a ramp signal, a triangular-waveform signal or a sawtooth signal, for example, then the proportionality of this signal to the supply voltage relates to the fact that the peak-to-peak voltage of the ramp signal is proportional to the supply voltage.

The proportionality of the periodic signal to the supply voltage is produced, in one example, using an operational amplifier whose input side is connected to the supply voltage and whose output side is coupled to the signal generator in order to feed it.

So that the frequency of the periodic signal always remains constant despite the amplitude of the signal being linked to a possibly fluctuating supply voltage, there is advantageously provided a phase locked loop which ensures that the signal generator's frequency is constant.

The amplifier circuit described in one example is preferably of symmetrical design with two output stages which are each preferably in the form of inverters. The output nodes of the inverters are each preferably coupled to the output terminals of the output of the amplifier circuit via a series inductor. A stabilization capacitance is preferably connected between the two output terminals.

In one alternative, a digital implementation of the present invention is contemplated, wherein provision is made for the duty ratio always to be set proportionally to the supply voltage.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained below using an exemplary embodiment with reference to the figure.

DETAILED DESCRIPTION OF THE INVENTION

Figure 1:
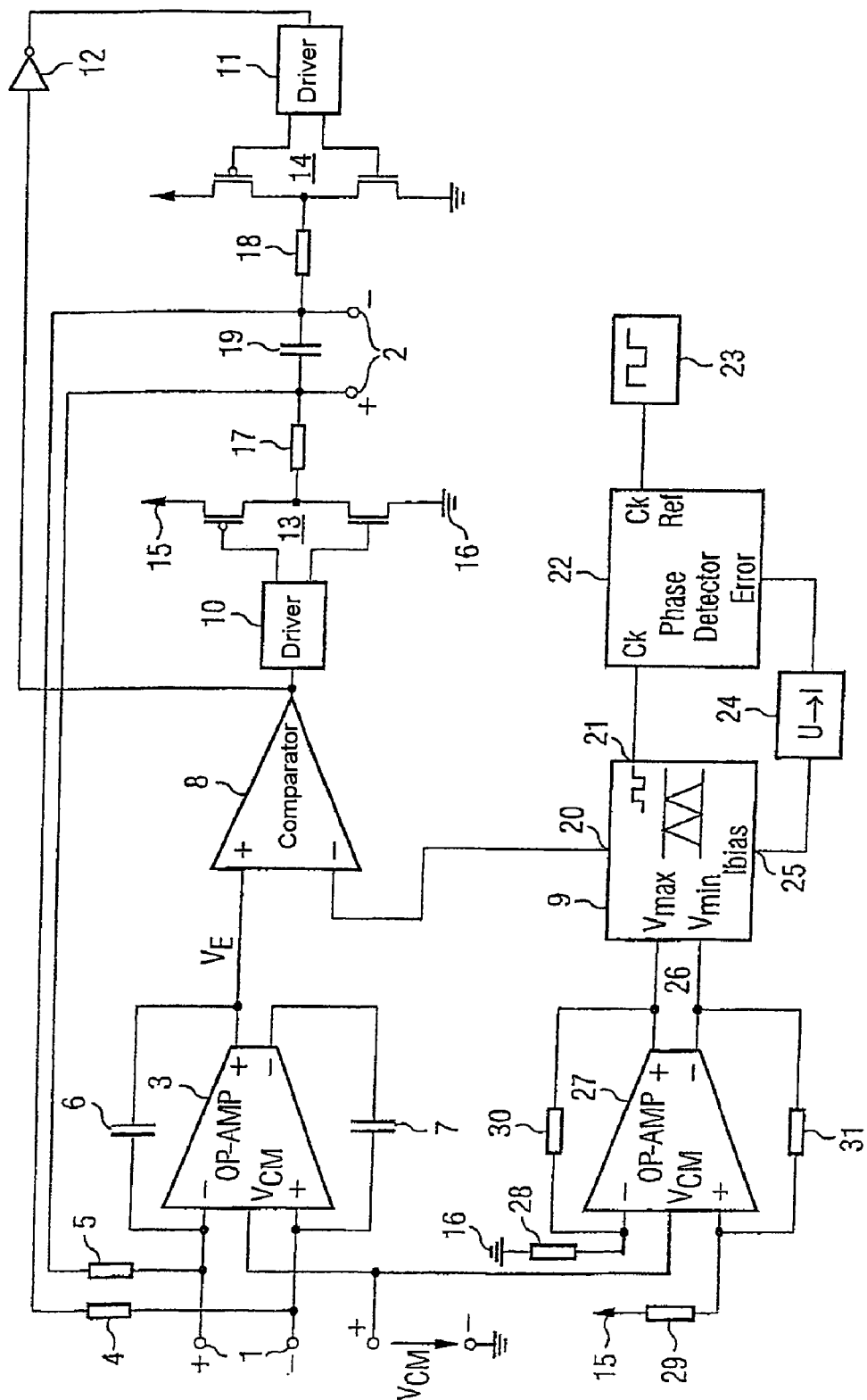
FIG. 1 is a block diagram illustrating an amplifier circuit according to an exemplary embodiment of the present invention.

FIG. 1 shows an amplifier circuit based on the present invention using a block diagram. This circuit comprises an input 1 for supplying a useful signal to be amplified which is in the form of a symmetrical input with a pair of differential input terminals. The signal amplified using the present amplifier circuit, which signal is derived from the signal applied to the input 1, can be tapped off at the output 2, which is likewise symmetrically in the form of a pair of output terminals.

The input 1 has an amplifier 3 connected to it which forms a differential signal from the signal difference between the signal applied to the input 1 and the signal provided at the output 2. This differential signal is provided at the symmetrical input of the operational amplifier 3. For this, the pair of output terminals 2 is connected to the input of the amplifier 3 via a respective resistor 4, 5. In addition, the two output terminals of the operational amplifier 3 are connected to the two inputs of the amplifier 3 in an inverting feedback loop via a respective capacitor 6, 7. In addition to the differential input and the differential output, the amplifier 3 also has a common-mode input for supplying a common-mode level $V_{cm}$. A common-mode signal may be supplied to this common-mode input.

Connected to one of the two output terminals of the differential amplifier 3 is the positive input of a comparator 8, whose negative input is connected to a signal generator 9. The output of the comparator 8 designed for pulse width modulation PWM is connected to a first output driver 10l directly and to a second output driver 11 via an inverter 12. The output drivers 10, 11 are respectively connected to the control inputs of a CMOS inverter 13, 14. The CMOS inverters 13, 14 each comprise a load-side series circuit comprising a p-channel MOS transistor and an n-channel MOS transistor which are connected between a supply potential connection 15 and a reference potential connection 16, as is usual for CMOS inverters. The outputs of the CMOS inverters 13, 14, which form the output stages of the present amplifier, each have their output node at the connecting node for the MOS transistors. These output nodes are connected to the output terminals 2 via a respective series inductor 17, 18. Connected between the output terminals 2 is a stabilization capacitance 19 which forms an LC filter together with the series inductors 17, 18.

The signal generator 9 is in the form of a triangular-waveform signal generator which provides a periodic signal having a peak-to-peak voltage $V_{max}-V_{min}$ at an output 20, said voltage being obtained from the difference between an upper peak value $V_{max}$ and a lower peak valve $V_{min}$.

The frequency (conditioned as a digital clock signal) of the periodic signal provided by the signal generator is provided at a digital clock output 21 which is connected to a first input on a phase detector 22. A further input on the phase detector 22 is connected to a reference clock source 23. The output of the phase detector 22, which provides any phase error between the two input signals, is routed via a voltage/current converter 24 to the quiescent current input 25 of the signal generator 9.

The amplitude $V_{max}-V_{min}$ is set at a symmetrically designed amplitude control input 26 on the signal generator 9. Connected to this input is the differential output of a further operational amplifier 27. The negative input of the operational amplifier 27 is connected to reference potential 16 via a resistor 28. The positive input of the operational amplifier 27 is connected to supply potential connection 15 via a further resistor 29. In this case, the supply and reference potential connections 15, 16 match the supply voltage connections 15, 16 of the output stages 13, 14 in the amplifier. The operational amplifier 27 likewise has a common-mode input which is connected to the common-mode input of the operational amplifier 3 for the purpose of supplying the common-mode signal $V_{cm}$. The operational amplifier 27 has a negative feedback loop from the differential output to the differential input via a respective resistor 30, 31.

It can clearly be seen that the peak-to-peak voltage $V_{max}-V_{min}$ of the ramp signal provided by the signal generator 9 is proportional to the supply voltage for the amplifier. The bias current of the signal generator 9 is controlled by a phase locked loop in order to keep the frequency of the periodic signal constant while the peak-to-peak voltage $V_{max}$–$V_{min}$ changes. When designing the circuit, it is important to remember that the bandwidths of the two control loops, namely that of the amplifier and that of the phase controller, are greater than the cut-off frequency of the low-pass filter.

The present amplifier circuit significantly improves the linearity of the output stage. A further improvement could be attained, by way of example, by increasing the bandwidth of the open loop gain. With the feed-forward technology presented, there is no need for error compensation for any interference components on the supply voltage.

As already explained, the principle described, namely the setting of the peak-to-peak voltage of the periodic signal proportionally to the supply voltage, allows a significant improvement in the power supply rejection ratio and at the same time makes it possible to avoid unwanted convolution effects to a large extent. In this case, the principle described can be implemented using particularly simple circuit means and with little complexity.

Instead of the illustrated analog actuation of the reference signal generator 9 with the aim of keeping the duty ratio constant regardless of the supply voltage, a digital implementation may also be provided. For this, the supply voltage would be converted into a digital voltage signal using an analog/digital converter, and the duty ratio of the pulse width modulation would be tracked proportionally to the supply voltage.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes"; "having", "has", "with", or variants thereof are used in either the detailed description and the claims, such terms are intended to be inclusive in a manner similar to the term "comprising".

The invention claimed is:

1. An amplifier circuit, comprising:
an input configured to receive a useful signal to be amplified;
an output configured to tap off or output an amplified version of the useful signal;
a differential amplifier comprising a first input connected to the input of the amplifier circuit, a second input coupled to the output of the amplifier circuit, and an output;
a comparator comprising a first input connected to the output of the differential amplifier, and a second input configured to receive a periodic signal;
an output stage comprising an input coupled to an output of the comparator, an output coupled to the amplifier output, and a supply connection for receiving a supply voltage; and
a signal generator connected to the second input of the comparator and configured to provide the periodic signal at an amplitude which is proportional to the supply voltage at the output stage, the signal generator configured as a phase locked loop to regulate a frequency of the periodic signal based on a reference clock.

2. The amplifier circuit of claim 1, further comprising an operational amplifier comprising two inputs connected to a supply potential connection and to a reference potential connection, respectively, and configured to supply, at an output thereof, an amplitude control signal to the signal generator, wherein the signal generator employs the amplitude control signal to control the amplitude of the periodic signal.

3. The amplifier circuit of claim 1, wherein the phase locked loop comprises a phase detector comprising a first clock input, which is connected to a clock output of the signal generator to receive a signal associated with the periodic signal, a second input connected to a reference source to receive a reference clock signal, and an output coupled to a frequency control input of the signal generator, wherein the phase locked loop is operable to generate a frequency control signal based on a comparison of the signal associated with the periodic signal and the reference clock signal.

4. The amplifier circuit of claim 3, wherein the signal generator is configured to maintain a frequency of the periodic signal substantially constant via the frequency control signal.

5. The amplifier circuit of claim 3, wherein the phase locked loop further comprises a voltage-to-current converter coupled between an output of the phase detector and the signal generator, and operable to convert the frequency control signal from a voltage to a bias current for the signal generator.

6. The amplifier circuit of claim 1, wherein the signal generator comprises a ramp signal generator or a sawtooth signal generator.

7. The amplifier circuit of claim 1, further comprising a filter comprising an inductor connected in series to the output of the output stage.

8. The amplifier circuit of claim 1, wherein the amplifier circuit comprises a symmetrical output comprising a further output stage having an input coupled to the output of the comparator via an inverter.

9. The amplifier circuit of claim 8, wherein the output stage and the further output stage each comprise a CMOS inverter.

10. The amplifier circuit of claim 8, further comprising a filter comprising inductors connected in series, respectively, to the output of the output stage.

11. An amplifier circuit, comprising:
means for comparing an input signal of the amplifier circuit to an output signal of the amplifier circuit, and generating an error signal associated therewith;
means for comparing the error signal and a periodic signal and outputting a pulse width modulation control signal in response to the comparison;
an output stage configured to receive the pulse width modulation control signal and generate the amplifier circuit output signal in response; and means for generating the periodic signal, where the periodic signal has an amplitude which is proportional to a supply voltage at the output stage, wherein the means for generating is configured as a phase locked loop to regulate a frequency of the periodic signal based on a reference clock.

12. The amplifier circuit of claim 11, further comprising:
a supply voltage detection means operable to generate an amplitude control signal based on a magnitude of the amplifier circuit supply voltage; and
a periodic signal generating means operably coupled to the supply voltage detection means, and operable to vary a peak-to-peak amplitude of the periodic signal while maintaining the frequency thereof substantially constant based on the amplitude control signal.

13. The amplifier circuit of claim 12, wherein the periodic signal generating means comprises a phase detection means operable to compare a signal associated with the periodic signal to a reference clock signal and generate a frequency control signal associated therewith that is employed to maintain the frequency of the periodic signal substantially constant.

14. The amplifier circuit of claim 13, wherein the supply voltage detection means comprises a comparison means configured to compare the amplifier circuit supply voltage to a reference value, and generate the amplitude control signal in response thereto.

15. The amplifier circuit of claim 11, wherein the periodic signal comprises a sawtooth waveform signal or a ramp signal.

16. An amplifier circuit, comprising:
a first operational amplifier circuit having a non-inverting input and an inverting input, respectively, and having a differential input signal coupled thereto, the first operational amplifier circuit having a differential output comprising a non-inverting output and an inverting output coupled to the inverting input and the non-inverting input thereof, respectively, through capacitive elements, the first operational amplifier circuit also having a differential output signal of the amplifier circuit coupled to the non-inverting and inverting inputs thereof, wherein the first operational amplifier circuit is configured to output an error signal at the non-inverting output thereof based on a difference between the differential input signal and the differential output signal;
a comparator circuit having a first input coupled to the non-inverting input of the first operational amplifier circuit and receiving the error signal thereat, and a second input configured to receive a periodic signal, wherein the comparator is configured to output a pulse width modulation control signal based on a comparison of the error signal and the periodic signal; and
a signal generator circuit configured to generate the periodic signal at an amplitude which is proportional to a supply voltage at an output stage, the signal generator configured as a phase locked loop to regulate a frequency of the periodic signal based on a reference clock.

17. The amplifier circuit of claim 16, further comprising a second operational amplifier circuit having an inverting input coupled to a reference potential, a non-inverting input coupled to the supply voltage of the amplifier circuit, and a non-inverting output and an inverting output coupled to the inverting input and non-inverting input thereof, respectively, through resistive elements, and operable to generate an amplitude control signal at the output thereof based on a magnitude of the supply voltage, wherein the signal generator circuit is further configured to vary a peak-to-peak value of the periodic signal based thereon, while maintaining the frequency thereof substantially constant.

18. The amplifier circuit of claim 17, further comprising a phase detector circuit having a first input coupled to the signal generator circuit and configured to receive a signal associated with the periodic signal thereat, and a second input coupled to a reference clock circuit and configured to receive a reference clock signal thereat, and an output, wherein the phase detector circuit is configured to generate a phase error signal based on the first and second inputs, and wherein the signal generator circuit is configured to use the phase error signal to maintain the frequency of the periodic signal substantially constant.

19. The amplifier circuit of claim 16, further comprising an output stage coupled to the output of the comparator circuit, comprising:
a first driver circuit having an input coupled to the pulse width modulation control signal, and an output;
a first inverter circuit having an input coupled to the output of the first driver circuit;
a first inductor having a first terminal coupled to an output of the first inverter;
a second driver circuit having an input coupled to an inverted version of the pulse width modulation control signal, and an output;
a second inverter circuit having an input coupled to the output of the second driver circuit;
a second inductor having an input coupled to an output of the second inverter; and
a capacitor coupled between respective second terminals of the first and second inductors, wherein the second terminals of the first and second inductors form the differential output of the amplifier circuit and wherein the first and second inductors and the capacitor collectively form an LC filter.

20. The amplifier circuit of claim 16, wherein the periodic signal comprises a sawtooth waveform or a ramp signal.

* * * * *

UNITED STATES PATENT AND TRADEMARK OFFICE
CERTIFICATE OF CORRECTION

| | | |
|---|---|---|
| PATENT NO. | : 7,068,095 B2 | Page 1 of 1 |
| APPLICATION NO. | : 11/032703 | |
| DATED | : June 27, 2006 | |
| INVENTOR(S) | : Derek Bernardon | |

It is certified that error appears in the above-identified patent and that said Letters Patent is hereby corrected as shown below:

Column 4, line 16: Please delete the bracket symbol after the number 10.

Column 6, line 67: Please add the word --thereto-- after the word "response".

Signed and Sealed this

Fifth Day of December, 2006

JON W. DUDAS
*Director of the United States Patent and Trademark Office*